(12) United States Patent
Kim

(10) Patent No.: US 10,121,527 B2
(45) Date of Patent: Nov. 6, 2018

(54) MEMORY DEVICE, REFRESH METHOD, AND SYSTEM INCLUDING THE SAME

(71) Applicant: SK hynix Inc., Icheon-si Gyeonggi-do (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/637,067

(22) Filed: Jun. 29, 2017

(65) Prior Publication Data

US 2017/0301387 A1    Oct. 19, 2017

Related U.S. Application Data

(62) Division of application No. 15/066,098, filed on Mar. 10, 2016, now Pat. No. 9,728,244.

(30) Foreign Application Priority Data

Nov. 30, 2015  (KR) .................. 10-2015-0169382

(51) Int. Cl.
| | | |
|---|---|---|
| G11C 7/00 | (2006.01) | |
| G11C 11/406 | (2006.01) | |
| G06F 12/00 | (2006.01) | |
| G11C 11/408 | (2006.01) | |
| G06F 12/10 | (2016.01) | |

(52) U.S. Cl.
CPC ........... *G11C 11/406* (2013.01); *G06F 12/00* (2013.01); *G06F 12/10* (2013.01); *G11C 11/408* (2013.01); *G11C 11/40615* (2013.01); *G11C 11/40618* (2013.01); *G11C 11/40622* (2013.01); *G06F 2212/1032* (2013.01)

(58) Field of Classification Search
CPC ...................... G06F 12/10; G06F 2212/1032
See application file for complete search history.

(56) References Cited

U.S. PATENT DOCUMENTS

| | | | |
|---|---|---|---|
| 2011/0167192 A1* | 7/2011 | Iyer ......................... | G06F 12/06 711/5 |
| 2012/0026813 A1* | 2/2012 | Sato ....................... | G11C 11/406 365/194 |
| 2013/0100755 A1* | 4/2013 | Youn ................. | G11C 11/40615 365/222 |
| 2014/0189215 A1 | 7/2014 | Kang et al. | |
| 2014/0189226 A1 | 7/2014 | Seo | |

FOREIGN PATENT DOCUMENTS

KR    1020140088660 A    7/2014

* cited by examiner

*Primary Examiner* — Uyen B Tran
(74) *Attorney, Agent, or Firm* — William Park & Associates Ltd.

(57) ABSTRACT

A memory device may be provided. The memory device may include an active control section configured to output a row active signal in response to a refresh signal when an active signal is activated. The memory device may include a refresh management section configured to control the refresh signal to skip a refresh operation for an unused row address in response to a refresh command signal and a refresh skip signal, and output an active row address for controlling the refresh operation. The memory device may include a memory section configured to perform a refresh operation for only an area of a cell array corresponding to a used row address in response to the row active signal and the active row address.

8 Claims, 5 Drawing Sheets

MEMORY DEVICE, REFRESH METHOD, AND SYSTEM INCLUDING THE SAME

CROSS-REFERENCES TO RELATED APPLICATION

The present application claims priority under 35 U.S.C. § 119(a) to Korean application number 10-2015-0169382, filed on Nov. 30, 2015, in the Korean Intellectual Property Office, which is incorporated herein by reference in its entirety.

BACKGROUND

1. Technical Field

Various embodiments generally relate to a memory device, a refresh method, and a system including the same. More particularly, various embodiments may relate to a technology capable of reducing a refresh current of a memory device.

2. Related Art

Recently, there are demands for a DRAM with a large capacity in mobile electronic products including smart phones and the like. In general, in a semiconductor memory device such as a DRAM, data stored in a memory cell may be changed by a leakage current. Accordingly, in order to periodically recharge the data stored in the memory cell, a refresh operation is required.

That is, a memory cell of a dynamic semiconductor memory such as a DRAM stores data on a capacitive element. Due to charge leakage from the capacitive element, the memory cell should be periodically refreshed. A refresh process typically includes a step of performing a read operation in order to read a level of charge stored in the memory cell as is.

Particularly, a semiconductor memory device such as a DDR SDRAM (Double Data Rate Synchronous DRAM) includes a plurality of memory banks for storing data, wherein each of the plurality of memory banks includes tens of millions or more of memory cells. Each memory cell includes a cell capacitor and a cell transistor, and the semiconductor memory device stores data through an operation for charging or discharging charge in/from the cell capacitor.

The amount of the charge stored in the cell capacitor should always be constant, ideally, if there is no separate control. However, actually, due to a voltage difference with a peripheral circuit, the amount of the charge stored in the cell capacitor varies.

That is, charge may be discharged in the state in which the cell capacitor has been charged, or charge may be introduced in the state in which the cell capacitor has been discharged. As described above, a charge in the charge amount of the cell capacitor represents a charge in data stored in the cell capacitor, which represents loss of the stored data. In order to substantially prevent such data loss, the semiconductor memory device performs a refresh operation.

With the passage of time, different types of refresh methods have been developed. In a normal auto-refresh method, a refresh timer exists outside a memory chip and the memory chip performs a refresh operation in response to a periodical refresh command supplied by a controller.

In a self-refresh method, a refresh timer exists inside a memory chip and all memory chips require a refresh start command from a controller.

SUMMARY

Various embodiments may be directed to a memory device, a refresh method, and a system including the same, and to reduce a refresh current by performing refresh for only an area using a program.

In an embodiment, a memory device may be provided. The memory device may include an active control section configured to output a row active signal in response to a refresh signal when an active signal is activated. The memory device may include a refresh management section configured to control the refresh signal to skip a refresh operation for an unused row address in response to a refresh command signal and a refresh skip signal, and output an active row address for controlling the refresh operation. The memory device may include a memory section configured to perform a refresh operation for only an area of a cell array corresponding to a used row address in response to the row active signal and the active row address.

In an embodiment, a refresh method of a memory device may be provided. The refresh method of the memory device may include the step of mapping a virtual address to a physical address in a table of a memory management unit, loading a specific bit of the physical address, and setting a signal for masking a refresh operation of a memory device. The refresh method of the memory device may include the step of setting the signal for masking the refresh operation of the memory device in a mode register set of the memory device. The refresh method of the memory device may include the step of performing refresh for only a used memory area in response to a row control signal and a refresh signal set in the mode register set when a refresh management mode is entered. The refresh method of the memory device may include the step of releasing the refresh management mode.

In an embodiment, a system may be provided. The system may include a central processing unit configured to receive a program command and execute a corresponding program. The system may include a memory management unit configured to map a virtual address to a physical address in response to a command signal applied from the central processing unit, and extract row address information for performing a refresh operation for only an area, in which the program is executed, from the physical address. The system may include a memory controller configured to output a command signal and an address in response to the row address information applied from the memory management unit. The system may include a memory device configured to perform the refresh operation in response to the command signal and the address applied from the memory controller, and perform the refresh operation for only a used memory area in response to the row address information set in the memory management unit.

According an embodiment, it may be possible to reduce a refresh current by performing refresh for only an area using a program.

DETAILED DESCRIPTION

Hereinafter, a memory device, a refresh method, and a system including the same will be described below with reference to the accompanying drawings through various examples of embodiments.

Figure 1:
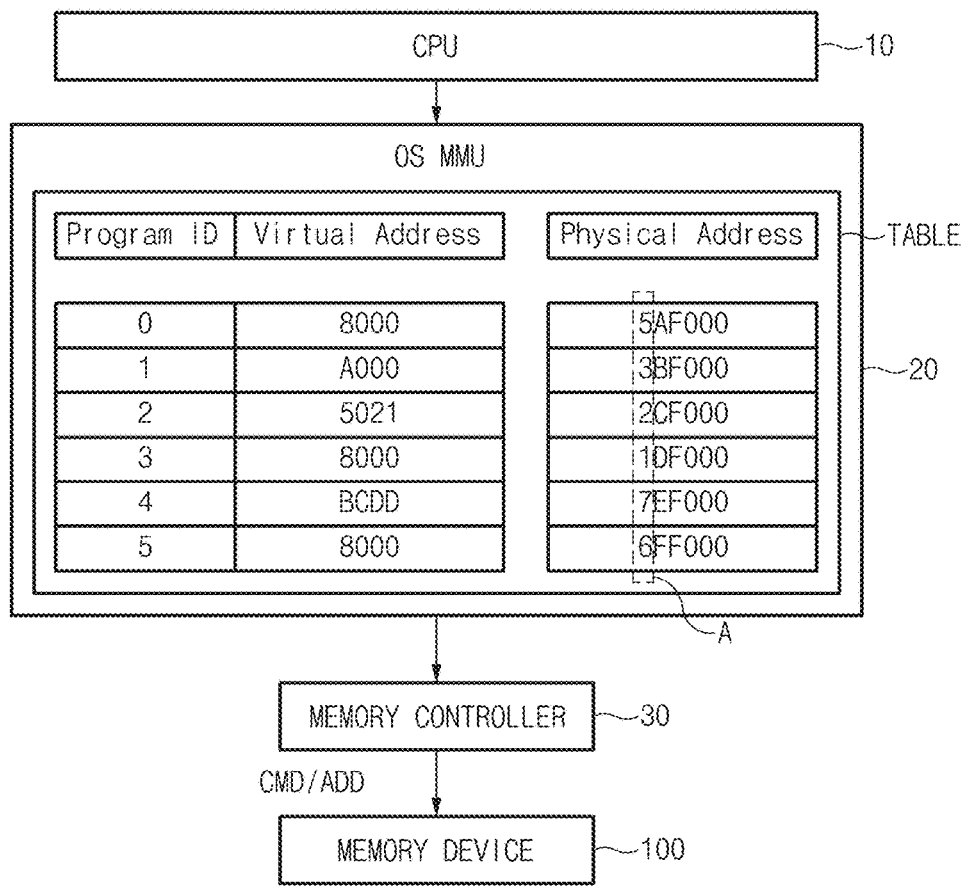
FIG. 1 is a configuration diagram illustrating a representation of an example of a system including a memory device according to an embodiment.

FIG. 1 is a configuration diagram illustrating a representation of an example of a system including a memory device according to an embodiment.

The system according to an embodiment may include a CPU (Central Processing Unit) 10, a MMU (Memory Management unit) 20, a memory controller 30, and a memory device 100.

The CPU 10 receives a program command from a user and performs the program command. Such a CPU 10 may include a control unit, an operation unit, a storage unit and the like.

The MMU 20 may perform address conversion between an actual memory and a virtual memory. That is, in a system including an OS (Operating System), it is necessary to perform an operation for dynamically generating or erasing a program in/from the memory device 100.

The MMU 20 processes addresses of a virtual memory area and a physical memory area. Such a MMU 20 converts a physical address and a command signal applied from the CPU 10, and outputs a conversion result to the memory controller 30.

The MMU 20 is a program that performs a function of substantially managing memory resources and the OS substantially manages program-based memory areas through the program.

For example, the MMU 20 includes a program ID field, a virtual address field, and a physical address field. Furthermore, the MMU 20 substantially manages the memory device 100 by running a table for mapping virtual addresses to physical addresses.

The table of FIG. 1 indicates one example of memory assignment stored in the MMU 20.

For example, the table indicates the state in which program 0 to program 5 have been activated when program IDs have been set to 0 to 5. Virtual addresses corresponding to the program IDs may be set to 8000, A000, 5021, 8000, BCDD, and 8000.

The table indicates a method in which the respective program IDs map memory areas corresponding to the virtual addresses to physical addresses. The MMU 20 converts such virtual addresses to physical addresses 5AF000, 3BF000, 2CF000, 1DF000, 7EF000, and 6FF000.

Using such physical addresses, addresses of the memory device 100 are generated. Bits of a specific area of the physical addresses are matched to row addresses of the memory device 100.

That is, the MMU 20 sets bit information of an area A of the physical addresses as row refresh information of the memory device 100, and outputs the row refresh information to the memory controller 30. The memory device 100 may skip a refresh operation in correspondence to the row address information applied from the memory controller 30.

The system dynamically assigns memory areas when programs are generated through the MMU 20, and releases the assignment of the memory areas when the programs disappear. Accordingly, the MMU 20 substantially manages corresponding memory areas such that they may be assigned when other programs are executed. Through such a method, the system may substantially manage limited physical memory areas more efficiently.

The memory controller 30 outputs a command signal CMD and an address ADD for controlling the operation of the memory device 100 in correspondence to a physical address and a control signal applied from the MMU 20.

For example, the memory device 100 performs an active operation, a precharge operation, a refresh operation, a read operation, a write operation and the like in correspondence to the command signal CMD and the address ADD applied from the memory controller 30. Such a memory device 100 may include a refresh management section 120, which will be described later, in the memory device 100.

As the memory capacity of a computing system increases, a current for operating the memory increases. Particularly, since a DRAM uses a refresh current in proportional to memory capacity according to its characteristics, an issue of a refresh current of a memory may be the biggest problem in a future high capacity memory computing system.

A memory system basically refreshes all memory cell arrays. Herein, the system refreshes all cells regardless of whether a corresponding area is used. Accordingly, reducing refresh for an area not actually used is a method for reducing a current while substantially maintaining the reliability of the system.

In the memory system, the OS (Operating System) MMU 20 substantially maintains information regarding whether physical addresses of a memory cell are actually used. The OS has a program for operating the MMU 20 therein. The program operates such that limited physical memory areas may be used by several programs. Accordingly, it may be possible to actually know a physical address area that is used or a physical address area discarded through the OS program.

In an embodiment, an area using no program and an area using the program in the system are determined through a physical address. A command decoder of the memory device 100 receives information on a row address using no program and a row address using the program from the MMU 20 through the memory controller 30.

Furthermore, in an embodiment, refresh of the memory device 100 for the area using no program is controlled to be skipped, so that a refresh current of the memory device 100 may be reduced.

Figure 2:
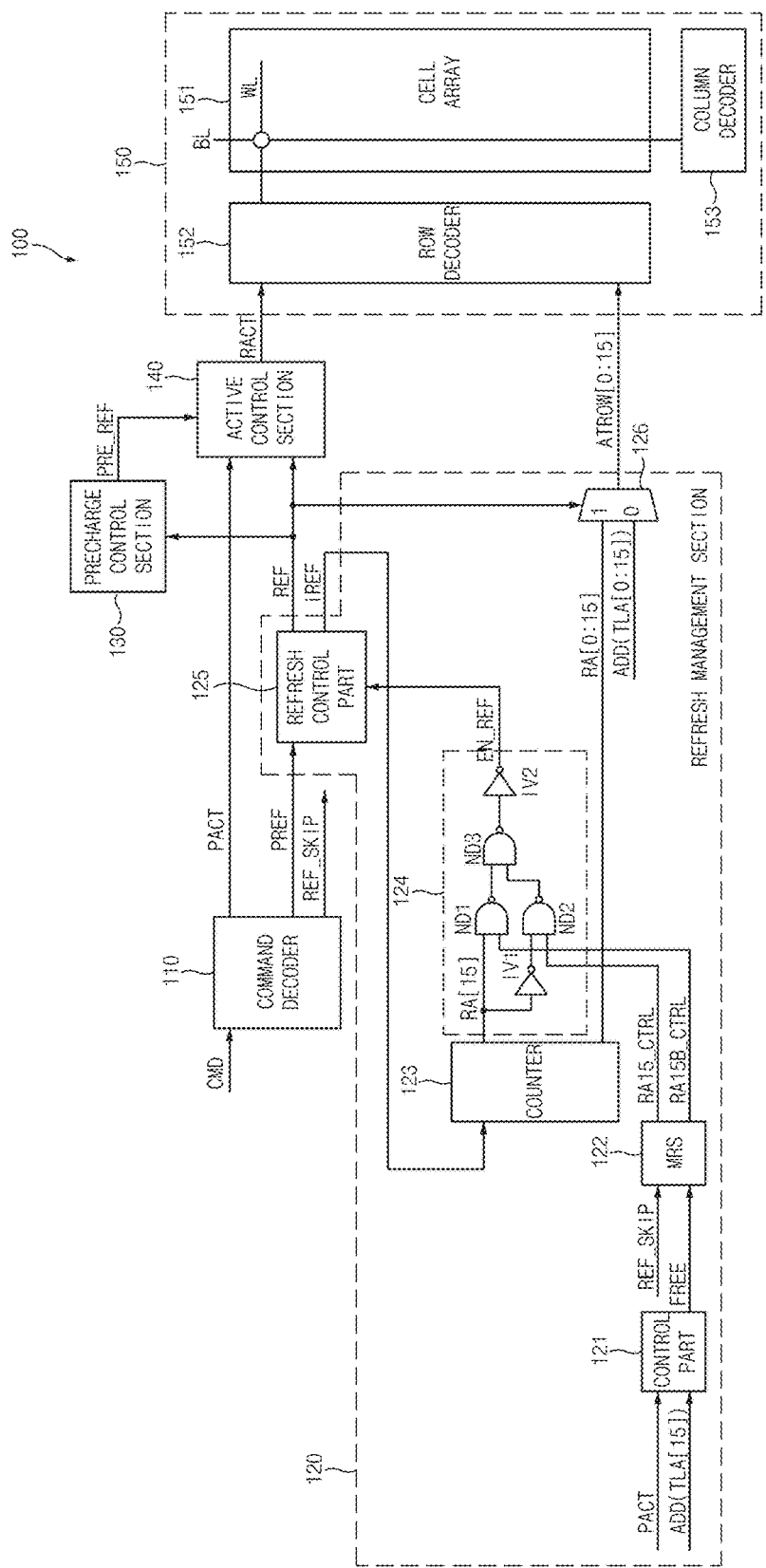
FIG. 2 is a configuration diagram illustrating a representation of an example of a memory device of FIG. 1.

FIG. 2 is a configuration diagram illustrating a representation of an example of the memory device 100 of FIG. 1.

The memory device 100 according to an embodiment may include a command decoder 110, a refresh management section 120, a precharge control section 130, an active control section 140, and a memory section 150.

The refresh management section 120 may include a control part 121, a MRS (Mode Register Set) 122, a counter 123, a combination part 124, a refresh control part 125, and a selection part 126. The memory section 150 includes a cell array 151, a row decoder 152, and a column decoder 153.

The command decoder 110 decodes a command signal CMD applied from the precharge control section 130, and outputs an active signal PACT, a refresh command signal PREF, and a refresh skip signal REF_SKIP.

The command decoder 110 outputs the active signal PACT to the active control section 140, outputs the refresh command signal PREF to the refresh control part 125, and outputs the refresh skip signal REF_SKIP to the MRS 122. In the state in which the refresh skip signal REF_SKIP has been activated, no refresh operation is performed.

The refresh management section 120 outputs a refresh signal REF for controlling a refresh operation to the precharge control section 130 and the active control section 140 in correspondence to the refresh command signal PREF, the active signal PACT, an address ADD, and the refresh skip signal REF_SKIP, and outputs active row addresses ATROW (for example, active row addresses ATROW [0:15]) to the memory section 150.

For example, at the time of activation of the refresh command signal PREF and the refresh skip signal REF_SKIP, the refresh management section 120 deactivates and outputs the refresh signal REF. At the time of deactivation of the refresh skip signal REF_SKIP, the refresh management section 120 controls the refresh signal REF in correspondence to the refresh command signal PREF.

The control part 121 receives the active signal PACT and the address ADD and outputs a free signal FREE to the MRS 122. The address ADD, for example, may be set as a latch address TLA[15]. The latch address TLA[15] may be a specific address of addresses latched after being buffered from the memory controller 30. In a normal operation, when the active signal PACT is activated, the control part 121 activates the free signal FREE in correspondence to the latch address TLA[15].

The MRS 122 receives the refresh skip signal REF_SKIP and the free signal FREE and outputs row control signals RA15_CTRL and RA15B_CTRL to the combination part 124. The row control signal RA15B_CTRL is an inversion signal of the row control signal RA15_CTRL. At the time of activation of the free signal FREE, the MRS 122 resets the row control signals RA15_CTRL and RA15B_CTRL.

The counter 123 counts a refresh signal iREF, outputs a row address RA[15] to the combination part 124, and outputs row addresses RA[0:15] to the selection part 126.

The combination part 124 combines the row address RA[15] with the row control signals RA15_CTRL and RA15B_CTRL with each other and outputs a refresh enable signal EN_REF to the refresh control part 125. Such a combination part 124 includes a plurality of inverters IV1 and IV2 and a plurality of logic gates, for example, NAND gates ND1 to ND3.

For example, the NAND gate ND1 performs a NAND operation on the row address RA[15] and the row control signal RA15_CTRL. The NAND gate ND2 performs a NAND operation on the row address RA[15] inverted by the inverter IV1 and the row control signal RA15B_CTRL. The NAND gate ND3 inverts the output of the NAND gate ND1 and the output of the NAND gate ND2 and outputs an inversion result to the inverter IV2. The inverter IV2 inverts the output of the NAND gate ND3 and outputs the refresh enable signal EN_REF.

For example, when the row address RA[15] is at a high level and the row control signal RA15_CTRL is at a high level, the refresh enable signal EN_REF enters a low level, so that no refresh operation is performed. However, when the row address RA[15] is at a low level and the row control signal RA15B_CTRL is at a high level, the refresh enable signal EN_REF enters a high level, so that a refresh operation is performed.

The refresh control part 125 outputs the refresh signal REF to the precharge control section 130, the active control section 140, and the selection part 126 in correspondence to the refresh command signal PREF and the refresh enable signal EN_REF, and outputs the refresh signal iREF to the counter 123.

The selection part 126 selects any one of the row addresses RA[0:15] and the address ADD in correspondence to the refresh signal REF. The address ADD, for example, may be set as latch addresses TLA[0:15]. The latch addresses TLA[0:15] may be addresses latched after being buffered from the memory controller 30.

The selection part 126 outputs the active row address ATROW to the row decoder 152. For example, when the refresh signal REF is at a high level, the selection part 126 outputs the active row address ATROW in correspondence to the row addresses RA[0:15]. When, for example, the refresh signal REF is at a low level, the selection part 126 outputs the active row address ATROW in correspondence to the latch addresses TLA[0:15] which are external addresses.

The precharge control section 130 outputs the precharge signal PRE_REF to the active control section 140 in correspondence to the refresh signal REF. After the refresh signal REF is activated, when a predetermined time is delayed, the precharge control section 130 activates the precharge signal PRE_REF for precharging the active control section 140. When the precharge signal PRE_REF is activated, a disabled area of the memory section 150 may be enabled.

For example, in the memory section 150, in order to access another row area, the precharge signal PRE_REF may be controlled to be reset and activated again. In this case, information regarding whether a corresponding row line is an enabled row line or a disabled row line may be known by the address ADD applied from the memory controller 30, for example, the latch addresses TLA[0:15].

The active control section 140 outputs a row active signal RACT to the row decoder 152 in correspondence to the precharge signal PRE_REF, the active signal PACT, and the refresh signal REF.

In the cell array 151 of the memory section 150, a read operation, a write operation, a precharge operation, or a refresh operation of data is performed in a selected cell in correspondence to decoding signals of the row decoder 152 and the column decoder 153. The row decoder 152 selects a row line of the cell array 151 in correspondence to the active row address ATROW and the row active signal RACT. The column decoder 153 selects a column line of the cell array 151 in correspondence to a column address. Referring to FIG. 2, bit lines BL extend from the column decoder 153 to the cell array 151 and word lines WL extend from the row decoder 152 to the cell array 151.

Figure 3:
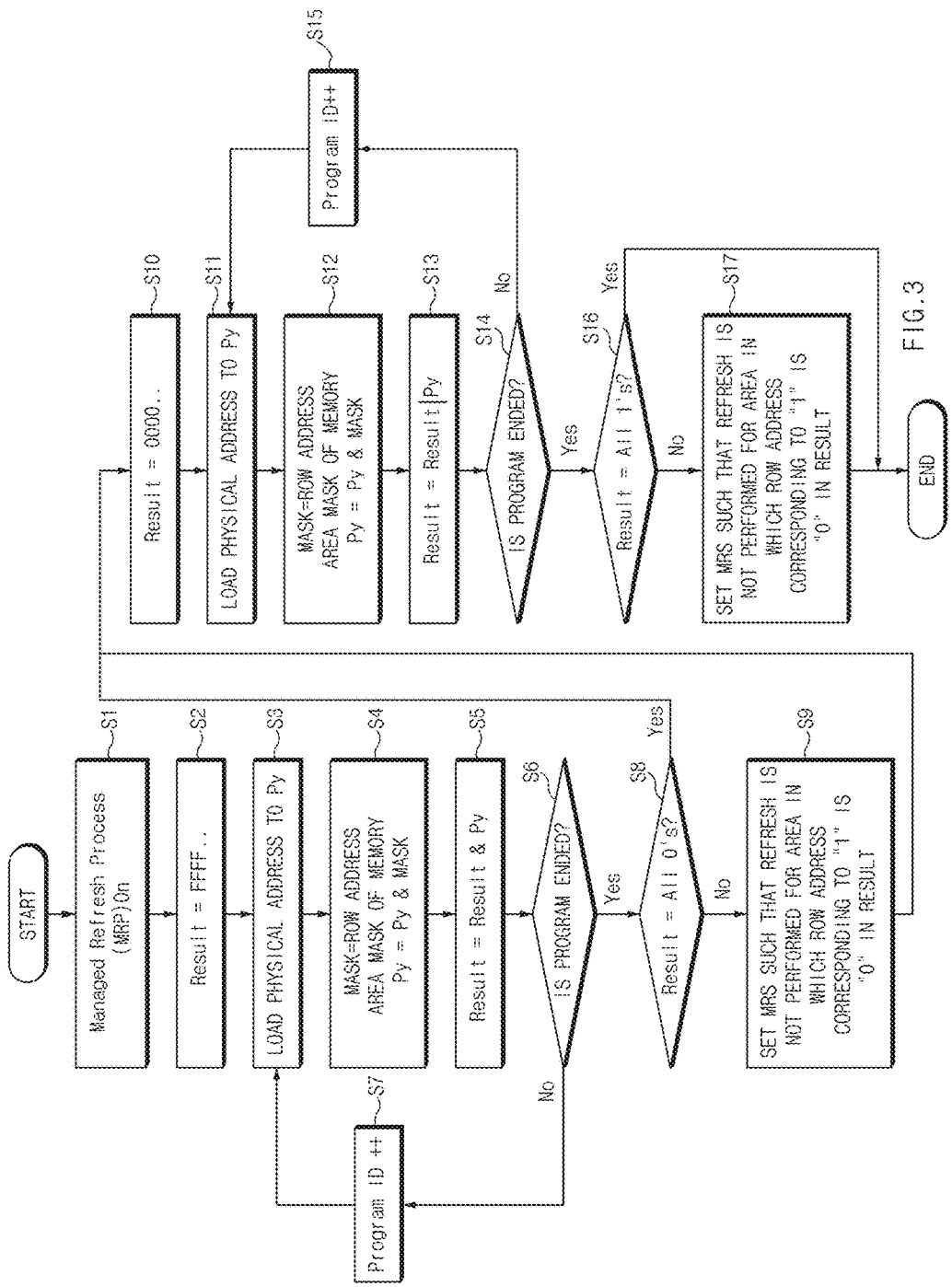
FIG. 3 is a flowchart representation of an example for explaining a refresh method of a memory device according to an embodiment of FIG. 2.

FIG. 3 is a flowchart representation of an example for explaining a refresh method of the memory device according to the embodiment of FIG. 2.

A MRP (Managed Refresh Process) mode is entered (step S1) and basic setting values, Result are set to "FFFF . . . " (FFFF is a hexadecimal bit value) (step S2). Physical addresses are loaded to a Py value from the MMU 20 (step S3). For example, row addresses of an area A of the physical addresses are extracted.

Then, a "row address area mask of a memory" is set as a mask (MASK) value and the Py value is set as a Py & MASK value (step S4). For example, all row addresses are read and the row addresses corresponding to the area A are assigned according to sizes. In the memory device 100, a refresh operation may be controlled not to be performed by a method in which a refresh operation command is masked and ignored with reference to the MASK value. The basic setting values Result are set as a Result & Py value (step S5).

Then, it is determined whether an operating program of the MMU 20 has been ended (step S6). When the operating program has not been ended, a program ID value of the MMU 20 is increased one by one and a physical address Py value is sequentially loaded (step S7).

When the operating program has been ended, it is determined whether all the basic setting values Result are "0" (step S8). When all the basic setting value Result are not "0", the MRS 122 is set such that refresh is not performed for an area in which a row address corresponding to "1" is "0" in the basic setting values Result (step S9).

However, when all the basic setting value Result are "0", the basic setting values Result are set to "0000 . . . " (0000 is a hexadecimal bit value) (step S10). Then, physical addresses are loaded to the Py value from the MMU 20 (step S11). That is, the row addresses of the area A of the physical addresses are extracted.

Then, the "row address area mask of the memory" is set as the mask (MASK) value and the Py value is set as the Py & MASK value (& indicates an AND operation) (step S12). The basic setting values Result are set as a Result|Py value (| indicates an OR operation) (step S13).

Then, it is determined whether the operating program of the MMU 20 has been ended (step S14). When the operating program has not been ended, the program ID value of the MMU 20 is increased one by one and the physical address Py value is sequentially loaded (step S15).

When the operating program has been ended, it is determined whether all the basic setting values Result are "1" (step S16). When all the basic setting value Result are not "1", the MRS 122 is set such that refresh is not performed for an area in which a row address corresponding to "0" is "1" in the basic setting values Result (step S17).

The algorithm of the refresh control operation as described above may be executed by the CPU 10 in an embodiment. However, the embodiments are not limited thereto and such an algorithm may also be executed by the MMU 20 or the memory controller 30.

The refresh method of the memory device according to an embodiment may be largely classified into four steps of a MRP (Managed Refresh Program) step, a MRS (Mode Register Set) setting step, a MR (Managed Refresh, a refresh management mode) step, and a free FREE step.

In the MRP step, the OS of the MMU 20 operates to substantially maintain the refresh program. In the MRS setting step, the memory controller 30 sets the MRS 122 of the memory device 100. In the MR step, the memory device 100 performs a refresh reduction operation in correspondence to the setting mode of the MRS 122. In the refresh step, the MR step is escaped.

The operation of each step will be described below.

The MRP step may be started by the OS MMU 20. When there is a relative margin in a memory assignment situation through system monitoring, the OS may perform the MRP step.

This is similar to a memory management operation such as garbage collection, and may be performed at an assigned spare time in order to improve system performance. This is because basic refresh reduction is possible when programs assigned to a memory are small. Accordingly, the OS may use the MRP mode as a concept of power-down.

When the MMU 20 satisfies specific conditions, the MRP mode is entered and the MRP operation, which is a preceding step for MR (Managed Refresh), is performed. In the MRP step, the table of the MMU 20 is used as illustrated, for example, in FIG. 1.

In the table of the MMU 20, the area A corresponding to the row addresses of the memory device 100 among the physical addresses Py set for each program ID may be used.

Figure 4:
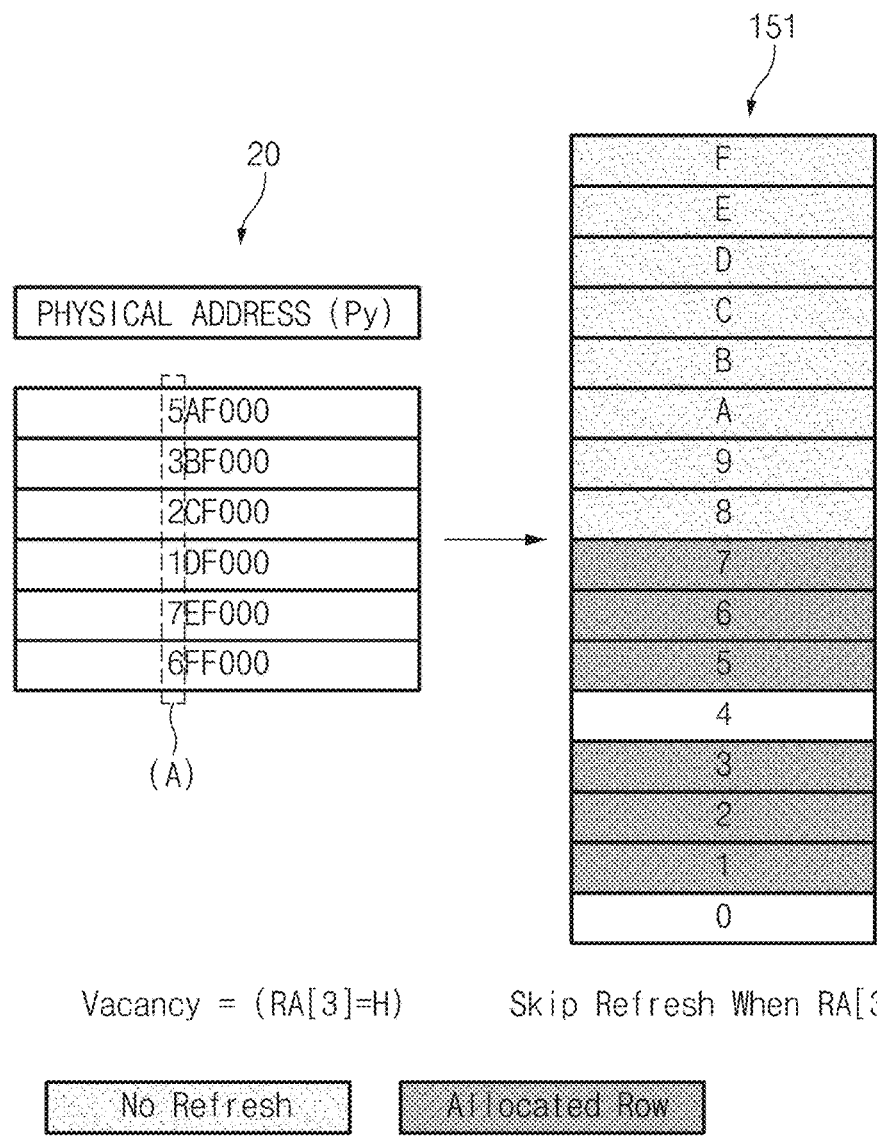
FIG. 4 and FIG. 5 are diagrams representing examples for explaining an operation of a memory device according to an embodiment of FIG. 2.

For example, as illustrated in FIG. 4, it may be assumed that physical addresses mapped to the table of the MMU 20 are 5AF000, 3BF000, 2CF000, 1DF000, 7EF000, and 6FF000.

It may be assumed that upper 4 bits (1-Hexa) of the physical addresses are the row addresses of the memory device 100. The row addresses of the area A are extracted from the physical addresses and an OR operation is performed on all values.

TABLE 1

| Row addresses of area A | 4 bits | | | |
|---|---|---|---|---|
| 5 | 0 | 1 | 0 | 1 |
| 3 | 0 | 0 | 1 | 1 |
| 2 | 0 | 0 | 1 | 0 |
| 1 | 0 | 0 | 0 | 1 |
| 7 | 0 | 1 | 1 | 1 |
| 6 | 0 | 1 | 1 | 0 |
| OR operation result | 0 | 1 | 1 | 1 |

That is, as illustrated in Table 1 above, when an OR operation of 5|3|2|1|7|6 is performed (| indicates an OR operation), the operation result is 7.

7=4'b0111, and it represents that the MMU 20 substantially manages only an area in which the most significant 1 bit is "0" in the 4-bit row addresses RA[3], RA[2], RA[1], and RA[0]. That is, since the 4-bit row addresses do not exceed 8, it represents that row addresses of 8 or more are not needed to be refreshed in the cell array 151 of the memory device 100.

Figure 5:
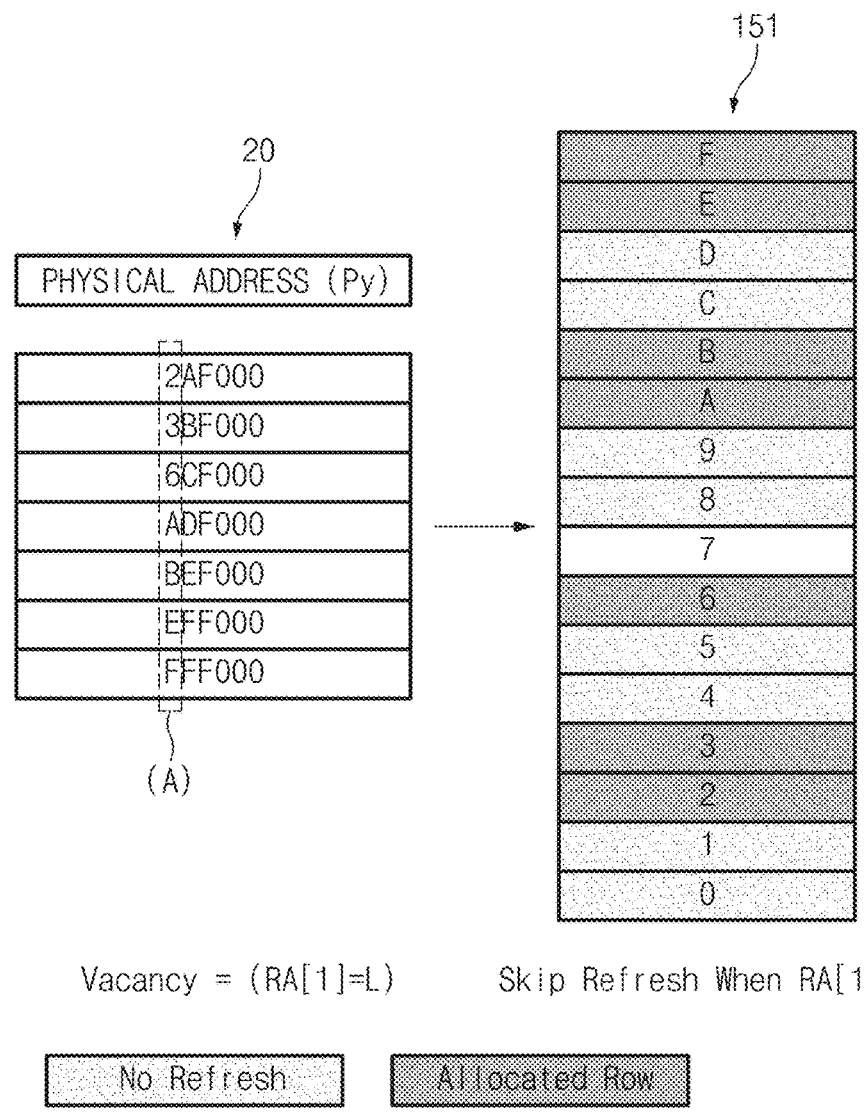

In another example, as illustrated in FIG. 5, it is assumed that physical addresses mapped to the table of the MMU 20 are 2AF000, 3BF000, 6CF000, ADF000, BEF000, EFF000, and FFF000. Furthermore, the row addresses of the area A are extracted from the physical addresses and an AND operation is performed on all values.

TABLE 2

| Row addresses of area A | 4 bits | | | |
|---|---|---|---|---|
| 2 | 0 | 0 | 1 | 0 |
| 3 | 0 | 0 | 1 | 1 |
| 6 | 0 | 1 | 1 | 0 |
| A | 1 | 0 | 1 | 0 |
| B | 1 | 0 | 1 | 1 |
| E | 1 | 1 | 1 | 0 |
| F | 1 | 1 | 1 | 1 |
| AND operation result | 0 | 0 | 1 | 0 |

That is, as illustrated in Table 2 above, when an AND operation of 2&3&6&10&11&14&15 is performed (& indicates an AND operation), the operation result is 2.

2=4'b0010, and it represents that only an area, in which the second bit is 1 (the row address RA[1]=1) in the least significant bits of the 4-bit row addresses RA[3], RA[2], RA[1], and RA[0], is used. In such a case, row addresses having a lower second bit of "0" among the row addresses are not needed to be refreshed in the cell array 151 of the memory device 100.

In the MRS step, the OS finds vacancy of row addresses not needed to be refreshed, and sets the memory device 100 through the memory controller 30 based on the vacancy.

Then, the memory controller 30 applies the command signal CMD to the command decoder 110, and when the refresh skip signal REF_SKIP is applied to the MRS 122, the MR step is entered. At this time, the latch address TLA[15] may be applied to the control part 121 as the address ADD.

In order to perform the MR mode, a circuit may be required to selectively perform refresh according to whether the row address RA is at a logic high level or a logic low level.

To this end, the refresh management section 120 skips refresh when the row address RA[15] is at a logic high level. To this end, the MRS 122 outputs the row control signal RA15_CTRL to a high level. When the row address RA[15] enters the logic high level, the refresh enable signal EN_REF enters a logic low level.

The refresh management section 120 skips refresh when the row address RA[15] is at a logic low level. To this end, the MRS 122 outputs the row control signal RA15B_CTRL to a high level. When the row address RA[15] enters the logic low level, the refresh enable signal EN_REF enters a logic low level.

Then, the refresh control part 125 outputs the refresh signal REF to a logic low level. Accordingly, the active control section 140 outputs the row active signal RACT to a logic low level, so that the memory section 150 performs no refresh.

When row active signal RACT is at the low level, it represents that a corresponding memory area of the memory device 100 is in a disabled state. Then, the row decoder 152 is deactivated, so that no refresh operation is performed for the corresponding area.

A program is assigned to the memory device 100 by the MMU 20 and the memory controller 30. Accordingly, the memory device 100 does not know that a data area of the memory section 150 is enabled (program assignment) or is disabled (program assignment release). In this case, since a memory area, in which the program assignment is released in the memory section 150, is meaningless, a refresh is not required.

Accordingly, in an embodiment, refresh may be performed for only an area enabled on the data area of the memory device 100 in correspondence to the physical addresses of the MMU 20. Consequently, in an embodiment, it may be possible to reduce the consumption of a refresh current due to an unnecessary refresh operation.

In the free FREE step, the refresh skip mode is released. When it is necessary to release an area in which refresh has been blocked, the system may use the area.

In an active operation, when the active signal PACT is activated and a corresponding address ADD is inputted, the control part 121 activates the free signal FREE to a high level. Then, the MRS 122 deactivates all the row control signals RA15_CTRL and RA15B_CTRL.

For example, when the row control signal RA15_CTRL enters a low level and the row address RA[15] enters a high level, the refresh enable signal EN_REF enters a logic high level. Accordingly, the memory section 150 releases a mode in which the refresh skip area has been set.

When the refresh skip area has been released, the active control section 140 outputs the row active signal RACT to a high level. When the row active signal RACT enters the high level, it represents that a corresponding area of the memory section 150 is in an enabled state. Then, the row decoder 152 is activated, so that a refresh operation is performed for the corresponding area.

In an embodiment, the example, in which the refresh control part 125 is provided in the memory device 100, has been described. However, the embodiments are not limited thereto, and the refresh control part 125 may also be included in the MMU 20 or the memory controller 30, or may also be separately positioned outside the MMU 20, the memory controller 30, and the memory device 100.

While various embodiments have been described above, it will be understood to those skilled in the art that the embodiments described are by way of example only. Accordingly, the memory device, the refresh method, and the system including the same described herein should not be limited based on the described embodiments.

What is claimed is:

1. A refresh method comprising the steps of:
   mapping a virtual address to a physical address in a table of a memory management unit, loading a specific bit of the physical address;
   extracting a row address information for performing a refresh operation for only an area, in which a program is executed, from the physical address;
   setting a signal for masking the refresh operation of a memory device in a mode register set of the memory device;
   outputting a refresh command signal and an address in response to the row address information applied from the memory management unit;
   controlling a refresh signal in response to the refresh command signal and a refresh skip signal for masking the refresh operation;
   performing the refresh operation in response to the refresh command signal, the address applied from a memory controller and the refresh skip signal for only a used memory area in correspondence to the row address information and a refresh signal set in the mode register set when a refresh management mode is entered;
   releasing the refresh management mode; and
   resetting the mode register set in response to an active signal and an external address.

2. The refresh method of claim 1, wherein the setting the signal for masking the refresh operation comprises:
   loading address bits for a specific area in the physical address as the row address information; and
   logically combining the address bits for the specific area with each other to generate the refresh skip signal and controlling a refresh for an area having a row address of "0" or "1" to be skipped.

3. The refresh method of claim 1, wherein the performing the refresh operation comprises:
   outputting a row active signal in response to the refresh signal when the active signal is activated;
   controlling the refresh signal to skip the refresh operation for an unused row address in response to the refresh command signal and the refresh skip signal;
   outputting an active row address for controlling the refresh operation; and
   performing the refresh operation for only an area of a cell array corresponding to a used row address in response to the row active signal and the active row address.

4. The refresh method of claim 3, wherein the performing the refresh operation further comprises:
   decoding a command signal applied from an exterior;
   outputting the active signal, the refresh command signal, and the refresh skip signal; and
   outputting a precharge signal in response to the refresh signal.

5. The refresh method of claim 3, wherein the performing the refresh operation further comprises:
   receiving information on the unused row address and the used row address from an external memory management unit.

6. The refresh method of claim 3, wherein the performing the refresh operation further comprises:
outputting a row control signal in response to the refresh skip signal and a free signal;
counting the refresh signal and outputs a row address;
combining the row address with the row control signal and outputting a refresh enable signal;
controlling the refresh signal in response to the refresh command signal and the refresh enable signal; and
selecting any one of an output counting address and the external address in response to the refresh signal and output the active row address.

7. The refresh method of claim 6:
wherein the refresh operation not to be performed when the refresh enable signal enters a row level when a specific first row address of the row addresses is at a high level and the row control signal is at a high level, and
wherein the refresh operation to be performed when the refresh enable signal enters a high level when the first row address is at a low level and the row control signal is at the high level.

8. The refresh method of claim 6, wherein the selecting further comprises:
selecting the counting address when the refresh signal is activated; and
selecting the external address when the refresh signal is deactivated.

* * * * *